United States Patent
Zeng

(10) Patent No.: US 11,051,412 B2
(45) Date of Patent: Jun. 29, 2021

(54) ELECTRONIC DEVICE

(71) Applicant: GUANGDONG OPPO MOBILE TELECOMMUNICATIONS CORP., LTD., Guangdong (CN)

(72) Inventor: Yuanqing Zeng, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/649,858

(22) PCT Filed: Nov. 16, 2018

(86) PCT No.: PCT/CN2018/115898
§ 371 (c)(1),
(2) Date: Mar. 23, 2020

(87) PCT Pub. No.: WO2019/101011
PCT Pub. Date: May 31, 2019

(65) Prior Publication Data
US 2020/0275560 A1    Aug. 27, 2020

(30) Foreign Application Priority Data

Nov. 27, 2017 (CN) .......................... 201711208567.8
Nov. 27, 2017 (CN) .......................... 201721619270.6

(51) Int. Cl.
*H05K 5/00*         (2006.01)
*H05K 5/03*         (2006.01)
(Continued)

(52) U.S. Cl.
CPC ............ *H05K 5/0017* (2013.01); *G01P 13/00* (2013.01); *H01F 7/126* (2013.01); *H05K 5/03* (2013.01); *G06F 1/1626* (2013.01)

(58) Field of Classification Search
CPC .. H04M 1/185; H04M 2250/12; H04M 1/026; G06F 1/1656; G06F 2200/1633;
(Continued)

(56) References Cited

U.S. PATENT DOCUMENTS 8,305,744 B2* 11/2012 Shedletsky .......... H05K 5/0017
                                                361/679.21
9,612,622 B2*  4/2017 Moon ...................... H02H 7/20
(Continued)

FOREIGN PATENT DOCUMENTS

CN       104008705 A       8/2014
CN       106555799 A       4/2017
(Continued)

OTHER PUBLICATIONS

Extended European Search Report for EP application 18881273.9 dated Oct. 16, 2020.
(Continued)

*Primary Examiner* — Abhishek M Rathod

(57) ABSTRACT

An electronic device includes a middle frame, a display assembly, a rear member, and a protective member. The middle frame includes a sidewall disposed in an encircled manner; the display assembly is located at a front side of the middle frame; the rear member is located at a back side of the middle frame; the protective member is movably disposed on the sidewall of the middle frame. In an initial state, a front end and a rear end of the protective member are respectively lower than or flush with a surface of the display assembly or the rear member. The protective member can move toward the back side of the middle frame from the initial state to enable the rear end of the protective member to go beyond the rear member so as to protect the rear member when the electronic device falls off.

14 Claims, 19 Drawing Sheets

(51) Int. Cl.
*G06F 1/16* (2006.01)
*G01P 13/00* (2006.01)
*H01F 7/126* (2006.01)

(58) Field of Classification Search
CPC .. G06F 1/1626; H04B 1/3888; H05K 5/0086; H05K 5/03; H05K 5/0017
See application file for complete search history.

(56) References Cited

U.S. PATENT DOCUMENTS

| | | |
|---|---|---|
| 9,715,257 B2* | 7/2017 | Manullang ............ H04M 1/185 |
| 10,315,828 B2* | 6/2019 | Rivellini .................. H01F 7/17 |
| 10,715,645 B2* | 7/2020 | Wilson ................ H04B 1/3888 |
| 2011/0194230 A1* | 8/2011 | Hart ...................... H04M 1/185 |
| | | 361/437 |
| 2017/0047960 A1* | 2/2017 | Kil .......................... H04W 4/80 |
| 2017/0111076 A1* | 4/2017 | Choi ................... H04B 1/3888 |
| 2018/0295731 A1* | 10/2018 | Burdoucci ............ H04M 1/185 |

FOREIGN PATENT DOCUMENTS

| | | |
|---|---|---|
| CN | 107343073 A | 11/2017 |
| CN | 107870657 A | 4/2018 |
| CN | 207460300 U | 6/2018 |

OTHER PUBLICATIONS

English translation of ISR for PCT application PCT/CN2018/115898.

* cited by examiner

Z1-Z1

ELECTRONIC DEVICE

CROSS-REFERENCE TO RELATED APPLICATION(S)

This application is 371 application of International Patent Application No. PCT/CN2018/115898, filed on Nov. 16, 2018, which claims priority to Chinese Patent Application Serial No. 201711208567.8 and Chinese Patent Application Serial No. 201721619270.6, both filed on Nov. 27, 2017, the entire contents of all of which are incorporated herein by reference in their entireties.

TECHNICAL FIELD

The present application relates to a technical field of communication apparatuses, and more particularly, to an electronic device.

BACKGROUND

In related art, a rear cover of an electronic device usually protrudes from an outer frame, in order to improve the aesthetics of appearance of the electronic device (such as a mobile phone, a tablet computer, and the like).

SUMMARY

The present disclosure seeks to solve at least one of the technical problems existing in the related art. To this end, the present disclosure proposes an electronic device that has good anti-dropping performance and high reliability.

An electronic device according to embodiments of the present disclosure includes: a middle frame including a sidewall arranged in an encircled manner; a display assembly located at a front side of the middle frame; a rear member located at a rear side of the middle frame; and a protective member coupled to the sidewall of the middle frame and movable in forward and rearward directions. The protective member has an initial position where a front end of the protective member is lower than or flush with an outer surface of the display assembly and a rear end of the protective member is lower than or flush with an outer surface of the rear member; and a front position where the front end of the protective member exceeds the outer surface of the display assembly and protects the display assembly when the electronic device drops.

An electronic device according to embodiments of the present disclosure includes: a middle frame including a sidewall; a display assembly located at a front side of the middle frame; a rear member located at a rear side of the middle frame; and a protective member movably coupled to the sidewall of the middle frame. The protective member has an initial position where a front end of the protective member is lower than or flush with an outer surface of the display assembly and a rear end of the protective member is lower than or flush with an outer surface of the rear member; and a rear position where the rear end of the protective member exceeds the outer surface of the rear member and protects the rear member when the electronic device drops.

An electronic device according to embodiments of the present disclosure includes: a middle frame including a sidewall; a display assembly located at a front side of the middle frame; a rear member located at a rear side of the middle frame; a sensor configured to sense a dropping state of the electronic device; and a protective member movably coupled to the sidewall of the middle frame. The protective member has an initial position wherein a front end of the protective member is lower than or flush with an outer surface of the display assembly and a rear end of the protective member is lower than or flush with an outer surface of the rear member; a front position where the front end of the protective member exceeds the outer surface of the display assembly when the sensor senses the fall of the electronic device with the display assembly facing downwards; and a rear position where the rear end of the protective member exceeds the outer surface of the rear member when the sensor senses the fall of the electronic device with the rear member facing downwards.

Additional aspects and advantages of embodiments of present disclosure will be given in part in the following descriptions, become apparent in part from the following descriptions, or be learned from the practice of the embodiments of the present disclosure.

BRIEF DESCRIPTION OF DRAWINGS

These and/or other aspects and advantages of embodiments of the present disclosure will become apparent and more readily appreciated from the following descriptions of embodiments made with reference to the drawings, in which.

Figure 1:
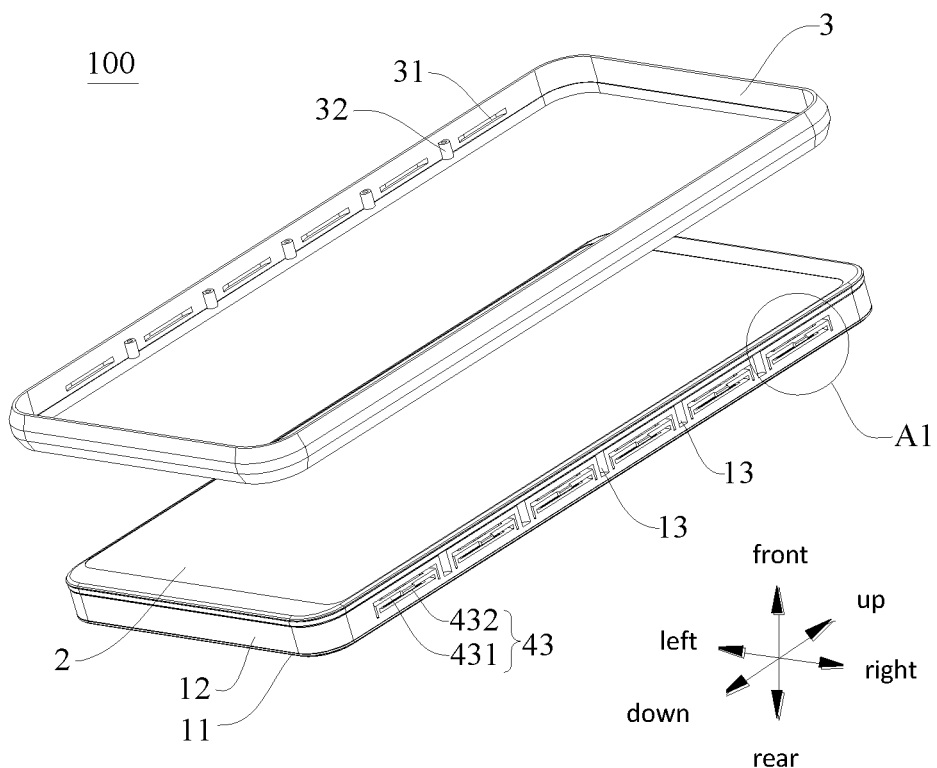
FIG. 1 illustrates an exploded view of an electronic device according to embodiments of the present disclosure.

REFERENCE NUMERALS electronic device 100,
  rear cover 11, middle frame 12, mounting groove 121, first movement space 1211, second movement space 1212, limiting groove 13,
  display assembly 2, protective member 3, fitting groove 31, limiting protrusion 32,
  first magnet 41, mounting hole 411, second magnet 42, elastic member 43, mounting post 430, elastic arm 431, snapping head 432, first sealing member 5, second sealing member 6, body portion 61, bent portion 62.

DETAILED DESCRIPTION

Embodiments of the present disclosure will be described in detail below, and examples of the embodiments will be illustrated in the accompanying drawings. The same or similar reference numerals represent the same or similar elements or the elements having the same or similar functions throughout the descriptions. The embodiments described below with reference to the accompanying drawings are illustrative, are merely used to explain the present disclosure, and cannot be construed to limit the present disclosure.

In the description of the present disclosure, it should be understood that terms such as "central," "longitudinal", "transverse," "length," "width," "thickness," "up," "down," "front," "rear," "left," "right," "vertical," "horizontal," "top," "bottom," "inner," "outer," "clockwise," "counter-clockwise," "axial," "radial," "circumferential" and the like should be construed to refer to the orientation as then described or as shown in the drawings under discussion. These terms are for convenience and simplification of description and do not indicate or imply that the device or element referred to must have a particular orientation, or be constructed and operated in a particular orientation, so these terms shall not be construed to limit the present disclosure. In addition, the feature defined with "first" and "second" may comprise one or more of this feature.

In the present disclosure, it should be noted, unless specified or limited otherwise, the terms "mounted," "connected," "coupled" or the like are used broadly. The terms may be, for example, fixed connections, detachable connections, or integral connections; may also be mechanical or electrical connections, may also be direct connections or indirect connections via intervening structures; and may also be inner communications of two elements, which can be understood by those skilled in the art according to specific situations.

As illustrated in FIGS. 1-4, an electronic device 100 according to one embodiment of the present disclosure includes a middle frame 12, a display assembly 2, a rear cover 11 (as an example of a rear member) and a protective member 3. The electronic device 100 may be a terminal, such as a mobile phone, a tablet computer, and the like.

Figure 3:
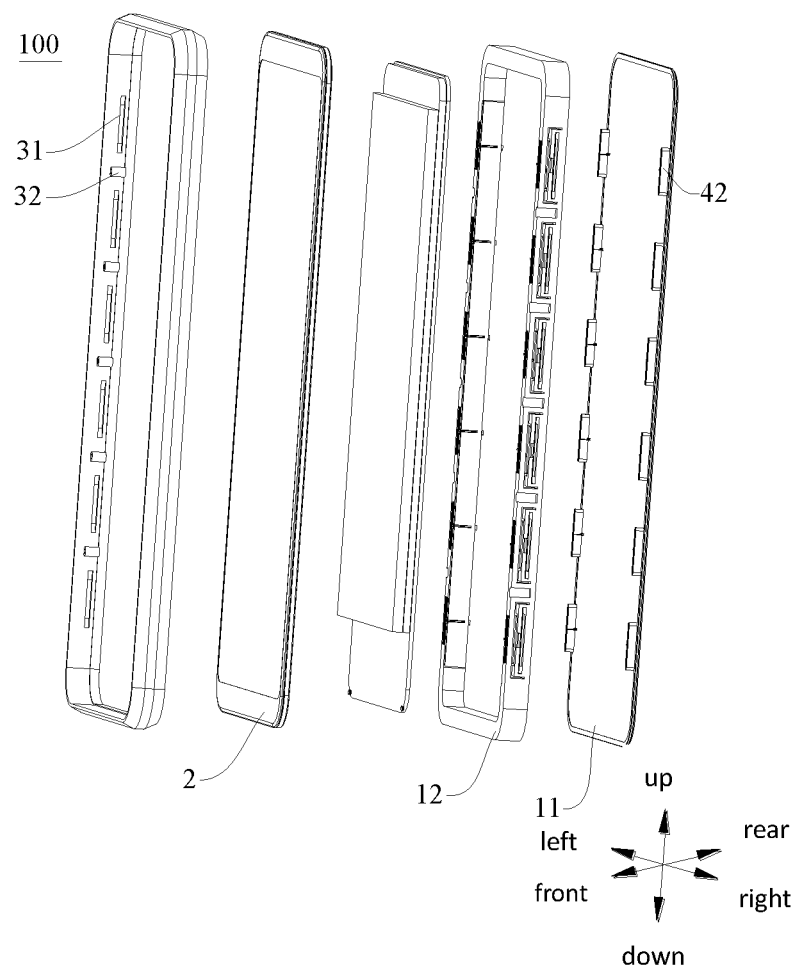
FIG. 3 illustrates another exploded view of an electronic device according to embodiments of the present disclosure.
Figure 4:
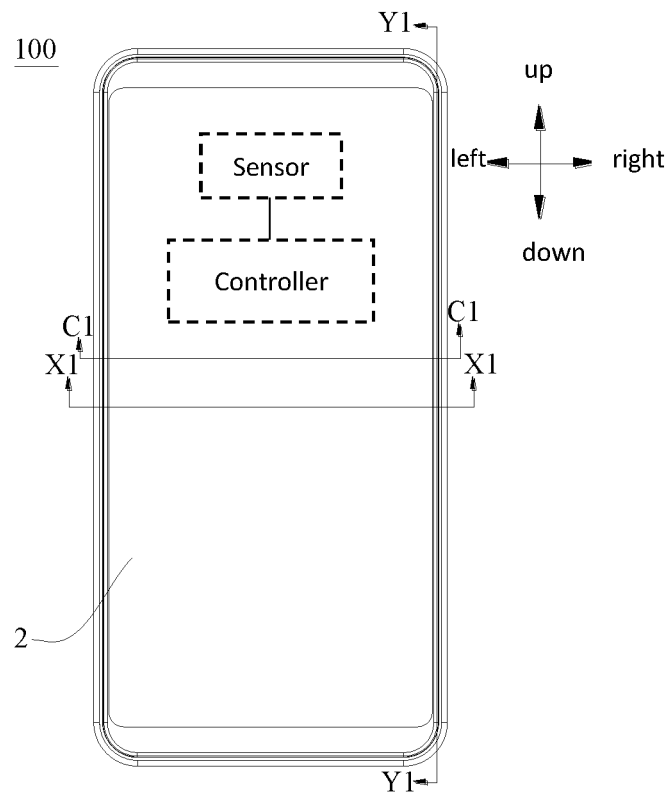
FIG. 4 illustrates a front view of an electronic device according to embodiments of the present disclosure, wherein a protective member is in an initial position.
Figure 28:
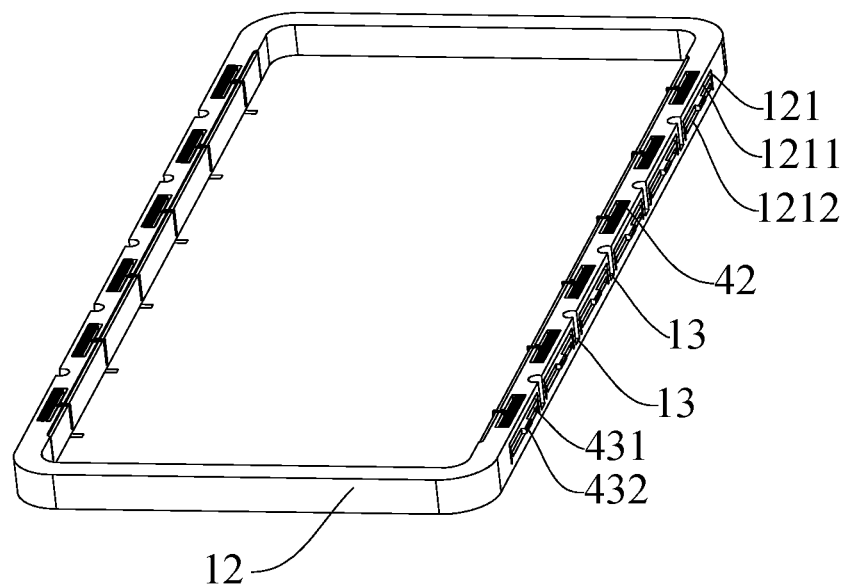
FIG. 28 illustrates a perspective view of a middle frame of an electronic device according to embodiments of the present disclosure.
Figure 29:
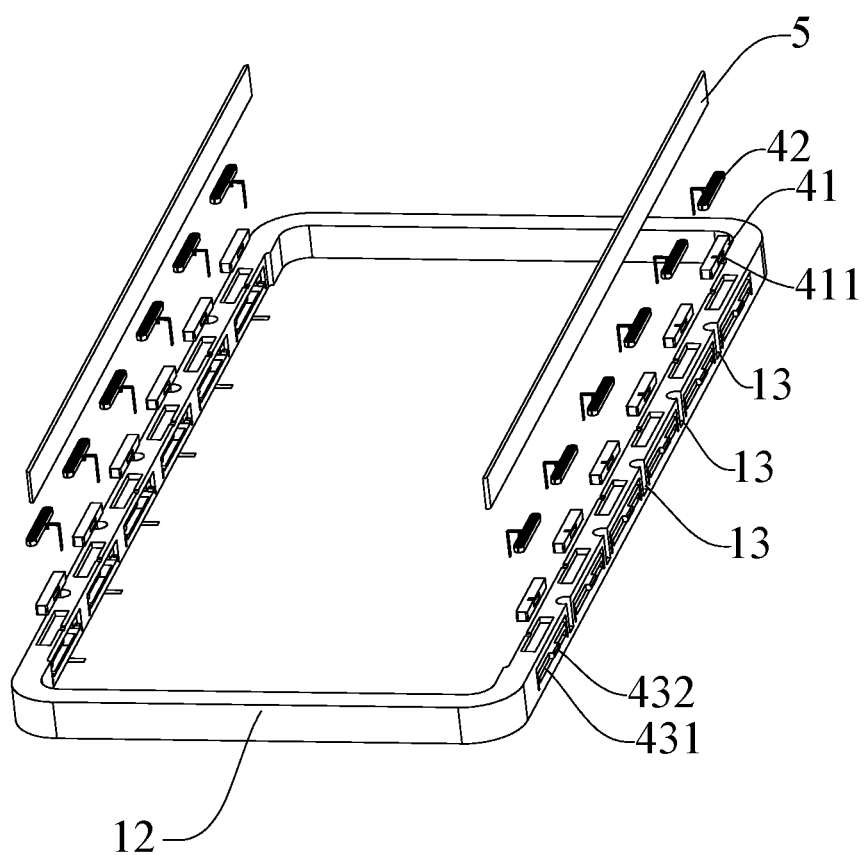
FIG. 29 illustrates an exploded view of the middle frame in FIG. 28.
Figure 30:
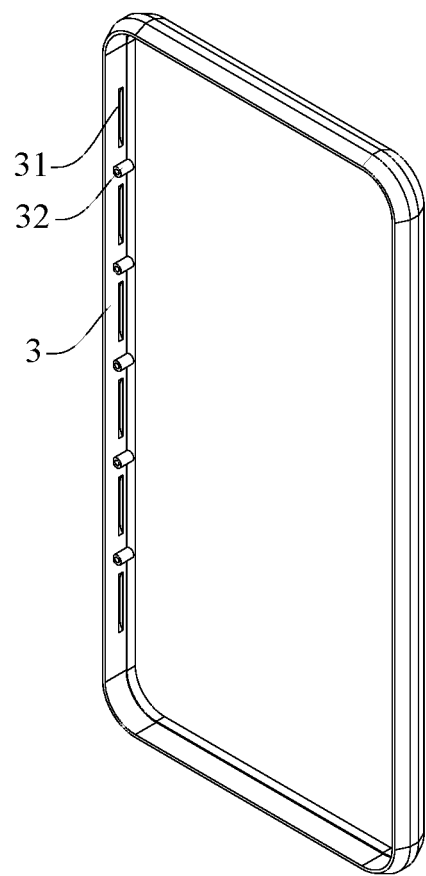
FIG. 30 illustrates a perspective view of a protective member according to embodiments of the present disclosure.
Figure 31:
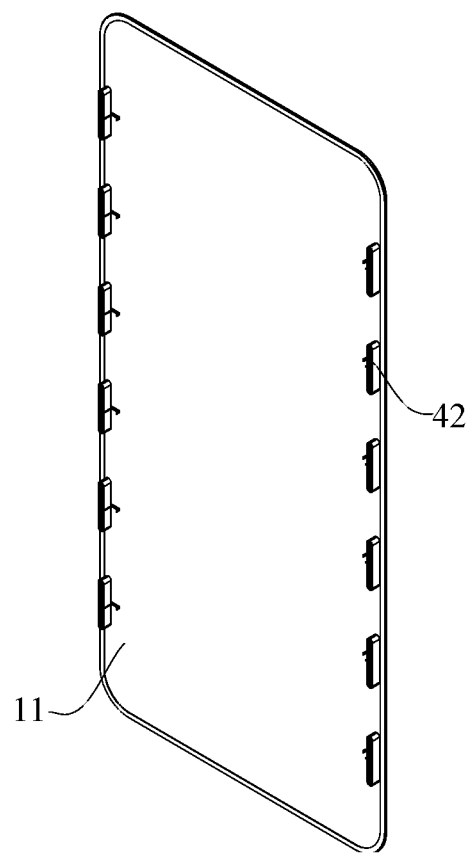
FIG. 31 illustrates a perspective view of a rear cover according to embodiments of the present disclosure.

Specifically, referring to FIG. 3 and in combination with FIGS. 28 and 29, the middle frame 12 includes a sidewall arranged in an encircled manner. For example, the middle frame 12 can be formed into a rectangular frame structure. The display assembly 2 is located at a front side of the middle frame 12 and the rear cover 11 is located at a rear side of the middle frame. Referring to FIG. 1 and FIG. 3 and in combination with FIG. 31, the rear cover 11 can be formed into a substantially rectangular plate-shaped structure. Optionally, the rear cover 11 can be a glass member or a ceramic member. That is, the rear cover 11 can be made of glass or ceramic. Thus, the appearance of the electronic device 100 and the hand feeling of the electronic device 100 during use can be improved.

The display assembly 2 can be used to display relevant information of the electronic device 100 (such as a menu and an interface of relevant applications). The display assembly 2 can also be used as an input apparatus, by which the user can input relevant control information to the electronic device 100. In one embodiment of the present disclosure, the display assembly 2 can be a touch display screen.

The protective member 3 can be movably arranged to the sidewall of the middle frame 12, and in an initial state, a front end and a rear end of the protective member 3 are lower than or flush with an outer surface of the display assembly 2 and an outer surface of the rear cover 11, respectively. The protective member 3 can move towards the rear side of the middle frame 12 from the initial state, such that the rear end of the protective member 3 exceeds the outer surface of the rear cover, thereby protecting the rear cover 11 when the electronic device 100 drops.

Specifically, in the initial state, the front end of the protective member 3 is lower than or flush with the outer surface of the display assembly 2 (for example, a front surface in FIG. 1) and the rear end of the protective member 3 is lower than or flush with the outer surface of the rear cover 11 (for example, a rear surface in FIG. 1). Thus, when in use, the overall appearance of the electronic device 100 can be effectively improved, avoiding that the protective member 3 affects the appearance of the electronic device 100, and meanwhile the hand feeling of the electronic device 100 can be effectively improved.

When the rear end of the protective member 3 exceeds the outer surface of the rear cover 11 by moving the protective member 3 towards the rear side of the middle frame 12 from the initial state, an outer periphery of the outer surface of the rear cover 11 is wrapped by the protective member 3 (as illustrated in FIGS. 19-26). For example, the protective member 3 can be pivoted towards or translated towards the rear side of the middle frame 12 such that the rear end of the protective member 3 exceeds the outer surface of the rear cover 11. Thus, when the electronic device 100 drops, the protective member 3 absorbs the impact of a face, onto which the electronic device drops, on the electronic device 100 to act as a buffer and protect the rear cover 11, so as to effectively prevent the rear cover 11 from being damaged due to fall, thereby protecting the electronic device 100 and improving the anti-dropping performance of the electronic device 100.

For example, when in use, the protective member 3 can be adjusted into the initial state to improve the aesthetics of the appearance and the hand feeling of the electronic device 100. When the electronic device 100 is not in use or drops, the protective members 3 can move towards the rear side of the middle frame 12 such that the rear end of the protective member 3 exceeds the outer surface of the rear cover 11, so as to protect the rear cover 11 when the electronic device 100 drops.

Here, it should be noted that an "inner" direction in the present disclosure refers to a direction adjacent to the center of the electronic device 100. Accordingly, an "outer" direction in the present disclosure refers to a direction away from the center of the electronic device 100.

In the electronic device 100 according to the present disclosure, with the arrangement of the protective member 3, the front end and the rear end of the protective member 3 are lower than or flush with the outer surfaces of the display assembly 2 and the rear cover 11 when in the initial state, and meanwhile, the protective member 3 can move from the initial state towards the rear side of the middle frame 12 to allow the rear end of the protective member 3 to exceed the outer surface of the rear cover 11. Thus, when in use, the protective member 3 can be adjusted to the initial state to improve the aesthetics of the appearance and the hand feeling of the electronic device 100. When the electronic device 100 is not in use or drops, the protective member 3 can be moved towards the rear side of the middle frame 12 such that the rear end of the protective member 3 exceeds the outer surface of the rear cover 11, so as to protect the rear cover 11 when the electronic device 100 drops, thereby improving the anti-dropping performance of the electronic device 100 on the premise of ensuring the aesthetics of the appearance and the hand feeling of the electronic device 100. The electronic device 100 has a simple structure and low production cost, hence improving the cost-performance ratio of the electronic device 100.

It could be understood that, in one embodiment, the electronic device 100 may be a mobile phone with a double-sided screen, that is, the electronic device 100 includes another display assembly arranged facing away from the display assembly 2, besides the display assembly 2. The other display assembly is provided at the rear side of the middle frame 12 and covered by the rear cover 11. In the present embodiment, the rear cover 11 may be a cover plate for the other display assembly. When the electronic device 100 is not in use or drops, the protective member 3 can be moved towards the rear side of the middle frame 12 such that the rear end of the protective member 3 exceeds the outer surface of the rear cover 11, so as to protect the rear cover 11 and the other display assembly when the electronic device 100 drops.

According to some embodiments of the present disclosure, the protective member 3 can move towards the front side of the middle frame 12 such that the front end of the protective member 13 exceeds the outer surface of the display assembly 2, so as to protect the display assembly 2 when the electronic device 100 drops. For example, the protective member can be pivoted towards or translated towards the front side of the middle frame 12 such that the front end of the protective member 3 exceeds the outer surface of the display assembly 2. Specifically, when the electronic device 100 is not in use or drops, the protective member 3 can be moved towards the front side of the middle frame 12 such that an outer periphery of the outer surface of the display assembly 12 is wrapped by the protective member 3 (as illustrated in FIGS. 12-18). Thus, with the protection of the protective member 3 to the display assembly 2, the display assembly 2 can be prevented from being damaged when the electronic device 100 drops.

According to some further embodiments of the present disclosure, the electronic device 100 also includes a driving assembly arranged at the middle frame 12. The driving assembly is configured to drive the protective member 3 to move to the rear side of the middle frame 12 such that the rear end of the protective member 3 exceeds the outer surface of the rear cover 11, or to drive the protective member 3 to move towards the front side of the middle frame 12 such that the front end of the protective member 3 exceeds the outer surface of the display assembly 2, or to drive the protective member 3 to be restored to the initial state.

For example, when the display assembly 2 falls towards a face (such as ground, desktop and the like), onto which the electronic device drops, the protective member 3 can be driven to move towards the front side of the middle frame 12 by the driving assembly such that the front end of the protective member 3 exceeds the outer surface of the display assembly 2, and the outer periphery of the outer surface of the display assembly 2 is wrapped by the protective member 3, so as to protect the display assembly 2 by the protective member 3 and prevent the display assembly 2 from being damaged when the electronic device 100 drops. When the rear cover 11 falls towards the face, the protective member 3 can be driven to move towards the rear side of the middle frame 12 by the driving assembly such that the rear end of the protective member 3 exceeds the outer surface of the rear cover 11 and the outer periphery of the outer surface of the rear cover 11 is wrapped by the protective member 3, so as to protect the rear cover 11 by the protective member 3, thereby preventing the rear cover 11 from being damaged when the electronic device 100 drops. Thus, during the fall of the electronic device 100, whether the display assembly 2 is falling towards the face or the rear cover 11 is falling towards the face, the protective member 3 can be first brought into contact with the face, and absorb the impact of the face on the electronic device 100 to play a buffering role, thereby effectively avoiding the damage of the display assembly 2 and the rear cover 11 due to the fall, further protecting the electronic device 100 and improving the anti-dropping performance of the electronic device 100.

For example, in some specific embodiments of the present disclosure, the electronic device 100 can be provided with a sensor configured to sense a dropping state of the electronic device 100, and the sensor is coupled with the driving assembly. Specifically, when the electronic device 100 drops, the sensor can sense whether a surface of the electronic device 100 facing towards the face is the display assembly 2 or the rear cover 11, and the driving assembly drives the protective member 3 to move according to a sensing result of the sensor, so as to protect the display assembly 2 and the rear cover 11 by the protective member 3.

According to some embodiments of the present disclosure, the driving assembly includes an elastic member 43, a first magnet 41, and at least one second magnet 42. One end of the elastic member 43 is coupled with the first magnet 41, and the other end of the elastic member 43 is fitted with the protective member 3. At least one of the above second magnets 42 is suitable to cooperate with the first magnet 41 to urge the elastic member 43 to drive the protective member to move towards the rear side of the middle frame 12, such that the rear end of the protective member 3 exceeds the outer surface of the rear cover 11; or at least one of the above second magnets 42 is suitable to cooperate with the first magnet 41 to urge the elastic member 43 to drive the protective member 3 to move towards the front side of the middle frame 12, such that the front end of the protective member 3 exceeds the outer surface of the display assembly 2.

Here, it should be noted that in the description of the present disclosure, the term "a plurality of" means two or more than two, unless specified otherwise.

For example, referring to FIG. 29, the first magnet 41 is provided with a mounting hole 411, the elastic member 43 is provided with a mounting post 430, and the mounting post 430 is fitted with the mounting hole 411 to fix the first magnet 41 on the elastic member 43. The structure is simple and the mounting is convenient.

Specifically, one second magnet 42 or a plurality of second magnets 42 can be provided. Optionally, the second magnet 42 can be arranged opposite the first magnet 41. In a case of one second magnet 42, when the electronic device 100 drops, the elastic member 43 can be driven to move through the cooperation between the second magnet 42 and the first magnet 41, and further the elastic member 43 drives the protective member 3 to move to the front side or the rear side of the middle frame 12, such that the front end of the protective member 3 exceeds the outer surface of the display assembly 2 or the rear end of the protective member 3 exceeds the outer surface of the rear cover 11.

For example, when the electronic device 100 drops, a repulsive force or an attractive force can be generated between the second magnet 42 and the first magnet 41 to urge the protective member 3 to move to the front side of the middle frame 12 or the rear side of the middle frame 12 by the elastic member 43, such that the front end of the protective member 3 exceeds the outer surface of the display assembly 2 or the rear end of the protective member 3 exceeds the outer surface of the rear cover 11.

In a case of a plurality of second magnets 42, when the electronic device 100 drops, at least one of the plurality of second magnets 42 cooperates with the first magnet 41 to urge the protective member 3 to move to the front side of the middle frame 12 or the rear side of the middle frame 12 by means of the elastic member 43, such that the front end of the protective member 3 exceeds the outer surface of the display assembly 2 or the rear end of the protective member 3 exceeds the outer surface of the rear cover 11.

Figure 32:
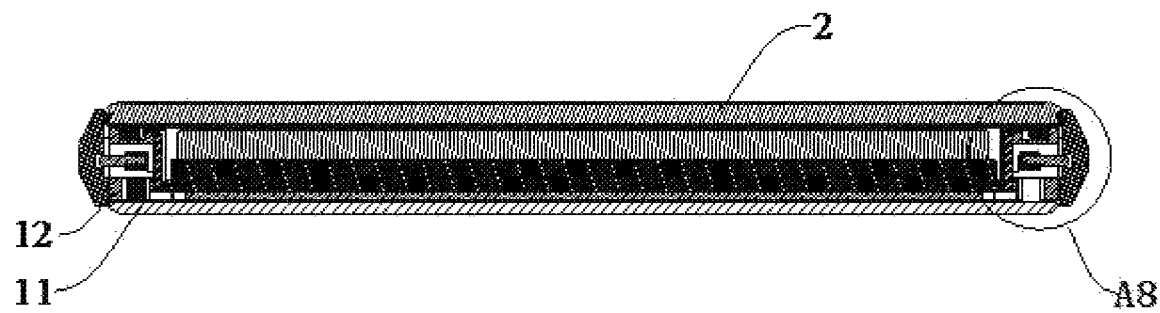
FIG. 32 illustrates a sectional view of an electronic device according to another embodiment of the present disclosure.
Figure 33:
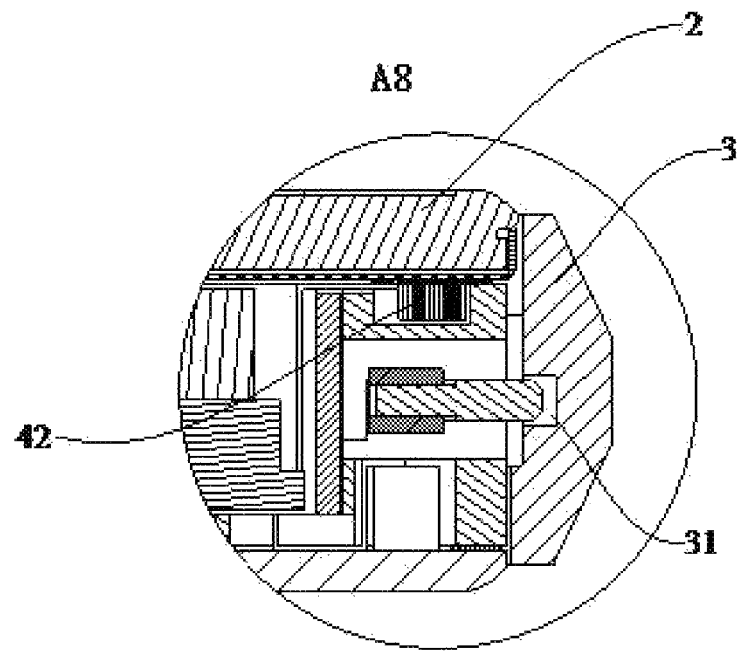
FIG. 33 illustrates an enlarged view of portion A8 circled in FIG. 32.

For example, in some examples of the present disclosure, there is one second magnet 42 and the second magnet 42 is arranged at a front side of the first magnet 41. Referring to FIG. 32 and in combination with FIG. 33, the second magnet 42 is arranged adjacent to the display assembly 2. In the present embodiment, when the display assembly 2 is falling towards the face during the fall of the electronic device 100, an attractive force can be generated between the first magnet 41 and the second magnet 42 to urge the first magnet 41 to move towards a direction close to the second magnet 42, so that the protective member 3 can be driven to move to the front side of the middle frame 12 by the elastic member 43, and hence the front end of the protective member 3 exceeds the outer surface of the display assembly 2. With the protection of the protective member 3 to the display assembly 2, the display assembly 2 is prevented from being damaged when the electronic device 100 drops.

When the rear cover 11 is falling towards the face during the fall of the electronic device 100, a repulsive force can be generated between the first magnet 41 and the second magnet 42 to move the first magnet 41 towards a direction away from the second magnet 42, so as to drive the protective member 3 to move to the rear side of the middle frame 12 by the elastic member 43, such that the rear end of the protective member 3 exceeds the outer surface of the rear cover 11. With the protection of the protective member 3 to the rear cover 11, the rear cover 11 is prevented from being damaged when the electronic device 100 drops.

Figure 34:
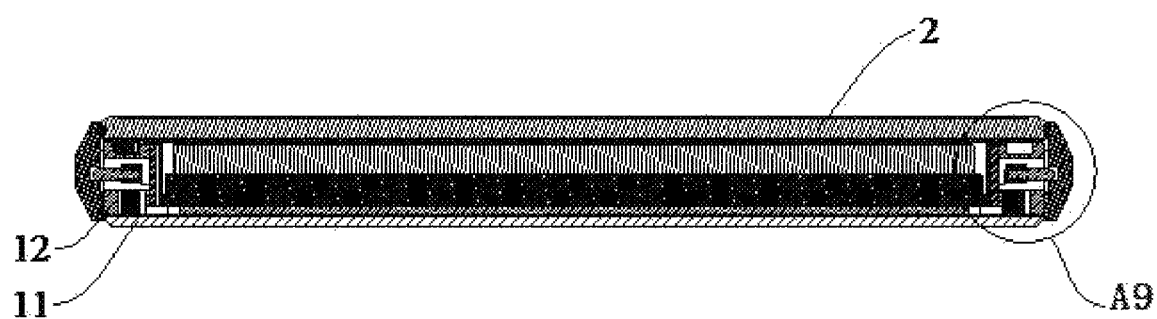
FIG. 34 illustrates a sectional view of an electronic device according to still another embodiment of the present disclosure.
Figure 35:
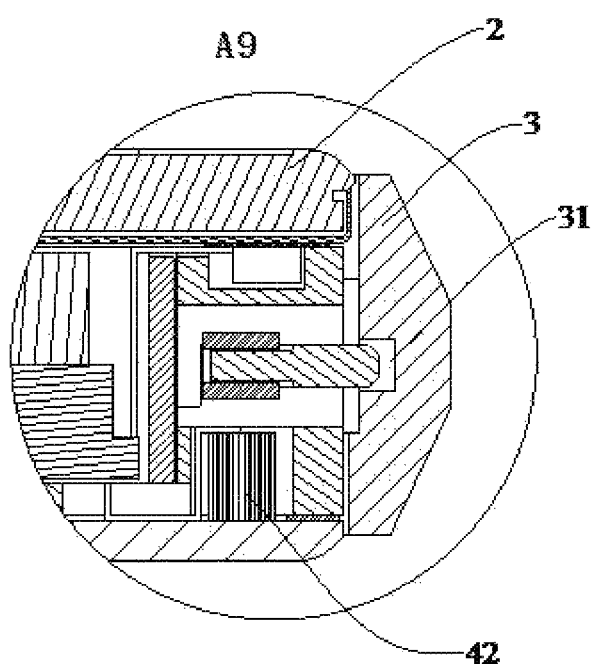
FIG. 35 illustrates an enlarged view of portion A9 circled in FIG. 34.

In some other examples of the present disclosure, one second magnet 42 is provided and arranged at a rear side of the first magnet 41. Referring to FIG. 34 and in combination with FIG. 35, the second magnet 42 is arranged adjacent to the rear cover 11. In the present embodiment, during the fall of the electronic device 100, when the display assembly 2 is falling towards the face, a repulsive force can be generated between the first magnet 41 and the second magnet 42 to move the first magnet 41 towards the direction away from the second magnet 42, so as to drive the protective member 3 to move to the front side of the middle frame 12 by the elastic member 43, such that the front end of the protective member 3 exceeds the outer surface of the display assembly 2. With the protection of the protective member 3 to the display assembly 2, the display assembly 2 is prevented from being damaged when the electronic device 100 drops. When the rear cover 11 is falling towards the face during the fall of the electronic device 100, an attractive force can be generated between the first magnet 41 and the second magnet 42 to move the first magnet 41 towards the direction close to the second magnet 42, so as to drive the protective member 3 to move to the rear side of the middle frame 12 by the elastic member 43, such that the rear end of the protective member 3 exceeds the outer surface of the rear cover 11. With the protection of the protective member 3 to the rear cover 11, the rear cover is prevented from being damaged when the electronic device 100 drops.

In some further examples of the present disclosure, two second magnets 42 are provided, and the two second magnets 42 are arranged on opposite sides of the first magnet 41 respectively. For example, referring to FIG. 21 and in combination with FIG. 22, the two second magnets 42 are arranged on the front and rear sides of the first magnet 41 respectively, the second magnet 42 located at the front side of the first magnet 41 is arranged adjacent to the display assembly 2, and the second magnet 42 located at the rear side of the first magnet 41 is arranged adjacent to the rear cover 11.

Specifically, directions of the forces generated between the two second magnets 42 and the first magnet 41 are consistent. For the convenience of description, the second magnet 42 located at the front side of the first magnet 41 is called as a "front second magnet," and the second magnet 42 located at the rear side of the first magnet 41 is called as a "rear second magnet." The front second magnet can be coupled with the display assembly 2, and the rear second magnet can be coupled with the rear cover 11. Thus, the positions of the front second magnet and the rear second magnet can be stabilized.

For example, in the present embodiment, when the display assembly 2 is falling towards the face during the fall of the electronic device 100, an attractive force can be generated between the first magnet 41 and the front second magnet, and at the same time a repulsive force can be generated between the first magnet 41 and the rear second magnet, to move the first magnet 41 towards a direction close to the front second magnet, so as to drive the protective member 3 to move to the front side of the middle frame 12 by the elastic member 43, such that the front end of the protective member 3 exceeds the outer surface of the display assembly 2. With the protection of the protective member 3 to the display assembly 2, the display assembly 2 is prevented from being damaged when the electronic device 100 drops. When the rear cover 11 is falling towards the face during the fall of the electronic device 100, a repulsive force can be generated between the first magnet 41 and the front second magnet, and at the same time an attractive force can be generated between the first magnet 41 and the rear second magnet 42, to move the first magnet 41 towards a direction away from the rear second magnet, so as to drive the protective member to move to the rear side of the middle frame 12 by the elastic member 43, such that the rear end of the protective member 3 exceeds the outer surface of the rear cover 11. With the protection of the protective member 3 to the rear cover 11, the rear cover 11 is prevented from being damaged when the electronic device 100 drops.

Optionally, the first magnet 41 is a permanent magnet and the second magnet 42 is an electromagnet. Thus, when the electronic device 100 drops, a coil of the electromagnet can be powered on to generate an attractive force or a repulsive force between the first magnet 41 and the second magnet 42, such that the movement of the protective member 3 can be realized by the cooperation of the first magnet 41 and the second magnet 42 to protect the electronic device 100.

It could be understood that in some other embodiments of the present disclosure, the first magnet 41 and the second magnet 42 may be both permanent magnets. In some further embodiments of the present disclosure, the first magnet 41 is an electromagnet, and the second magnet 42 is a permanent magnet. Thus, the movement of the protective member 3 can also be realized by the cooperation of the first magnet 41 and the second magnet 42 to protect the electronic device 100.

According to some further embodiments of the present disclosure, the electronic device 100 further includes: a sensor and a controller. The sensor is configured to sense a dropping state of the electronic device 100, and the controller is coupled with the at least one second magnet 42 and the sensor. When the sensor senses the fall of the electronic device 100, the controller is configured to control the at least one second magnet 42 to be powered on, to drive the protective member 3 to move to a first protection position or a second protection position by the elastic member 43, and when the sensor senses the standstill of the electronic device 100, the controller is configured to control the at least one second magnet 42 to be powered off.

For example, the sensor can sense whether the electronic device 100 is in the dropping state, and whether the surface towards the face is the display assembly 2 or the rear cover 11 during the fall of the electronic device 100. After the sensor transmits a detection signal to the controller, the power on and power off of the second magnet 42 are controlled by the controller to control the position of the protective member 3.

Optionally, the sensor is at least one of a gyroscope, an acceleration sensor, a gravity sensor, an inertia sensor, a camera, a height sensor, and a motion sensor. That is, the sensor may be one or more of the gyroscope, the acceleration sensor, the gravity sensor, the inertial sensor, the camera, the height sensor, and the motion sensor. For example, in one specific embodiment of the present disclosure, the sensors are the gyroscope and the gravity sensor. Thus, the dropping state of the electronic device 100 can be detected sensitively and accurately, and the reliability of the sensors can be ensured, which can further ensure the reliability of the electronic device 100.

Specifically, the protective member 3 is formed with a fitting groove 31, and the other end of the elastic member 43 mentioned-above is inserted into the fitting groove 31 to be fitted with the protective member 3. For example, referring to FIGS. 1, 3, 5-6, 13-14, 19, 21-22, and 30, the fitting groove 31 is defined in a sidewall of the protective member 3, which is thus convenient for the above end of the elastic member 43 to be fitted with the protective member 3.

In some embodiments of the present disclosure, the middle frame 12 is formed with a mounting groove 121, and the elastic member 43 is arranged in the mounting groove 121. The elastic member 43 is configured to be elastically deformable in a moving direction of the protective member 3 to normally drive the protective member 3 towards an accommodated position.

For example, when the display assembly 2 is falling towards the face during the fall of the electronic device 100, the elastic member 43 is elastically deformed under the action of the first magnet 41 and the second magnet 42 and moves towards a direction close to the display assembly 2, and then further drives the protective member 3 to move to the front side of the middle frame 12, such that the front end of the protective member 3 exceeds the outer surface of the display assembly 2. When the electronic device 100 lands, the acting force between the first magnet 41 and the second magnet 42 disappears, and the force applied on the elastic member 43 and causing its elastic deformation disappears. The elastic member 43 is restored to a natural state under the action of its elastic force and drives the protective member 3 to move from the front side of the middle frame 12 to the initial state.

When the rear cover 11 is falling towards the face during the fall of the electronic device 100, the elastic member 43 is elastically deformed under the action of the first magnet 41 and the second magnet 42 and moves towards a direction close to the rear cover 11, and then further drives the protective member 3 to move to the rear side of the middle frame 12, such that the rear end of the protective member 3 exceeds the outer surface of the rear cover 11. When the electronic device 100 lands, the acting force between the first magnet 41 and the second magnet 42 disappears, and the force applied on the elastic member 43 and causing its elastic deformation disappears. The elastic member 43 is restored to a natural state under the action of its elastic force and drives the protective member 3 to move from the rear side of the middle frame 12 to the initial state.

Therefore, after the electronic device 100 lands, the protective member 3 can be driven from the front or rear side of the middle frame 12 to the initial state by the elastic member 43. The driving method is simple, reliable and greatly simplifies the structure of the electronic device 100, thereby reducing the number of parts of the electronic device 100 and the cost of the electronic device 100, and improving the cost-performance ratio of the electronic device 100.

Specifically, the elastic member 43 includes an elastic arm 431 and a snapping head 432. The elastic arm 431 is arranged in the mounting groove 121. A first movement space 1211 is defined between a side surface of the elastic arm 431 adjacent to the display assembly 2 and an inner wall of the mounting groove 121 opposite to the elastic arm 431. A second movement space 1212 is defined between a side surface of the elastic arm 431 away from the display assembly 2 and an inner wall of the mounting groove 121 opposite to the elastic arm 431.

Figure 2:
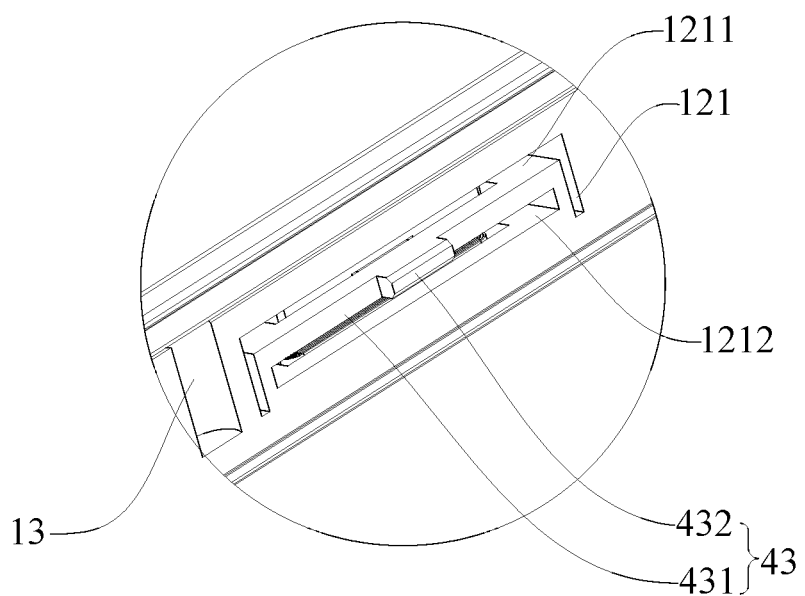
FIG. 2 illustrates an enlarged view of portion A1 circled in FIG. 1.

Specifically, in some examples of the present disclosure, for example, referring to FIGS. 2, 3 and 29, the mounting groove 121 is formed in the sidewall of the middle frame 12. The mounting groove 121 can be formed as a through groove penetrating along a thickness direction of the sidewall of the middle frame 12. The elastic arm 431 can be formed as a long strip. The first movement space 1211 is defined between a front surface of the elastic arm 431 and an inner wall of the mounting groove 121 opposite to the elastic arm 431, and the second movement space 1212 is defined between a rear surface of the elastic arm 431 and an inner wall of the mounting groove 121 opposite to the elastic arm 431. Thus, the elastic arm 431 is easy to be elastically deformed, the structure is simple, and the processing is convenient.

The snapping head 432 is arranged on the elastic arm 431 and is suitable to be inserted into the fitting groove 31 to be fitted with the protective member 3. Specifically, the snapping head 432 can be arranged on a side of the elastic arm 431 away from a center of the middle frame 12. For example, referring to FIG. 5 and in combination with FIG. 6, the snapping head 432 can be inserted into the fitting groove 32 to be snapped with the fitting groove 31. Thus, the protective member 3 can be firmly coupled to the middle frame 12 by the elastic member 43. When the elastic member 43 is elastically deformed, the protective member 3 can be driven by the fitting of the inner wall of the fitting groove 31 and the snapping head 432.

Furthermore, the elastic arm 431 is movable in a direction close to and away from the center of the middle frame 12, such that the snapping head 432 is movable between a first position where the snapping head 432 is fitted with the fitting groove 31 and a second position where the snapping head 432 is separated from the fitting groove 31. Thus, the mounting and dismounting of the protective assembly can be facilitated, reducing the mounting and dismounting difficulty and improving the mounting and dismounting efficiency of the protective assembly 3.

For example, in some embodiments of the present disclosure, the elastic arm 431 can be arranged in the mounting groove 121 and elastically deformable in a direction close to and away from the center of the middle frame 12 (for example, a left-right direction in FIG. 2). Thus, the elastic deformation of the elastic arm 431 can move the snapping head 432 between the first position where the snapping head 432 is fitted with the fitting groove 31 and the second position where the snapping head 432 is separated from the fitting groove 31, further simplifying the structure of the middle frame 12, reducing the number of parts of the middle frame 12, and lowering the overall cost of the electronic device 100.

For example, in the process of mounting the protective member 3, an inner wall of the protective member 3 can press the snapping head 432 to allow the elastic arm 431 to be elastically deformed towards the direction close to the center of the middle frame 12. When the fitting groove 31 is aligned with the mounting groove 121, the elastic arm 431 can move towards the direction away from the center of the middle frame 12 to restore the deformation, so as to urge the snapping head 432 to move towards a direction close to the fitting groove 31 such that the snapping head 432 is inserted into the fitting groove 31 to be fitted the fitting groove 31. In the process of dismounting the protective member 3, the snapping head 432 can be pressed in the direction close to the center of the middle frame 12, such that the snapping head 432 is separated from the fitting groove 32, and hence the protective member 3 can be detached from the middle frame 12 conveniently.

Optionally, the elastic member 43 is integrally arranged on the middle frame 12. Specifically, the elastic member 43 can be integrally arranged on the middle frame 12. Thus, the processing technic of the middle frame 12 can be simplified, the processing cost can be reduced, and the overall structural strength of the elastic member 43 can be improved.

For example, in some embodiments of the present disclosure, the elastic member 43 can be integrally formed with the middle frame 12. For another example, in other embodiments of the present disclosure, the elastic member 43 can also be formed by a cutting process in which case the middle frame 12 can be processed first, and then the elastic member 43 can be formed on the middle frame 12 by the cutting process.

Furthermore, the electronic device 100 further includes a first sealing member 5 arranged inside the middle frame 12 to seal the mounting groove 121. Specifically, referring to FIG. 3 and in combination with FIGS. 5 and 6, the first sealing member 5 can be arranged on the sidewall of the middle frame 12 and adjacent to the center of the middle frame 12. Thus, the mounting groove 121 can be sealed by the first sealing member 5 to prevent dust, liquid, and the like from entering the middle frame 12, thus improving the waterproof and dustproof performance of the middle frame 12, so as to enhance the reliability of the electronic device 100.

According to some embodiments of the present disclosure, the protective member 3 is formed in a closed-loop shape and is located outside the display assembly 2. The annular protective member 3 can wrap all the outer edges of the display assembly 2 and the rear cover 11, so as to improve the reliability of the protection for the display assembly 2 and the rear cover 11. A plurality of driving assemblies are provided, and the plurality of driving assemblies are spaced apart from each other along a circumferential direction of the display assembly 2. Thus, the plurality of driving assemblies can collectively drive the movement of the protective member 3, improving the smoothness of the movement of the protective member 3.

According to some further embodiments of the present disclosure, one of the middle frame 12 and the protective member 3 is provided with a plurality of limiting grooves 13 spaced apart from each other, and the other one of the middle frame 12 and the protective member 3 is provided with a plurality of limiting protrusions 32 fitted with the limiting grooves 13. That is, when the middle frame 12 is provided with the limiting grooves 13, the protective member 3 is provided with the limiting protrusions 32 fitted with the limiting grooves 13; when the middle frame 12 is provided with the limiting protrusions 32, the protective member 3 is provided with the limiting grooves 13 fitted with the limiting protrusions 32.

For example, referring to FIGS. 1, 7, 8 and 11, the middle frame 12 is provided with a plurality of limiting grooves 13 spaced along a circumferential direction thereof, the inner wall of the protective member 3 is provided with a plurality of limiting protrusions 32 spaced along a circumferential direction thereof, and the plurality of limiting grooves 13 are in one-to-one correspondence to the plurality of limiting protrusions 32. Optionally, an outer peripheral surface of the limiting protrusion 32 is substantially formed in a cylindrical shape, and an outer contour of the limiting groove 13 is formed in a rectangular shape. The fitting between the limiting protrusions 32 and the limiting grooves 13 can limit the movement of the protective member 3 in a length direction thereof (for example, an up-down direction in FIG. 1). Thus, the protective member 3 can be limited and fixed, which improves the reliability of the connection between the protective member 3 and the middle frame 12.

Furthermore, the electronic device 100 also includes a second sealing member 6 provided between the display assembly 2 and the middle frame 12, thereby improving the sealing performance of the electronic device 100, and preventing dust, liquid, and the like from entering the interior of the electronic device 100, which may otherwise affect the operation of the electronic device 100 or even cause damage to the electronic device 100.

Figure 5:
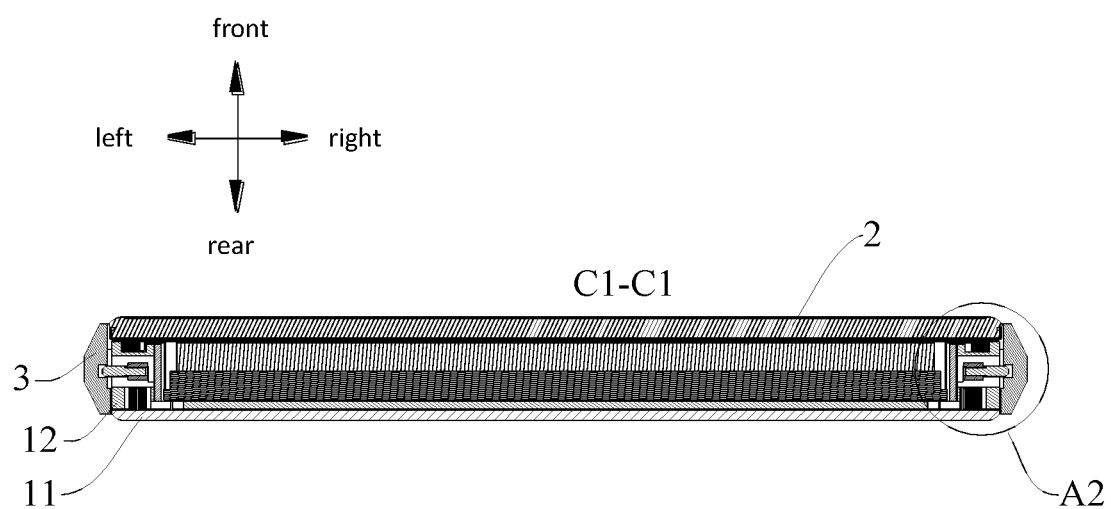
FIG. 5 illustrates a sectional view taken along line C1-C1 in FIG. 4.
Figure 6:
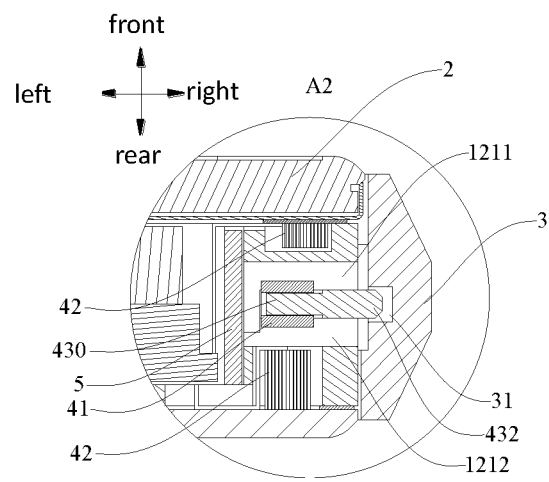
FIG. 6 illustrates an enlarged view of portion A2 circled in FIG. 5.
Figure 7:
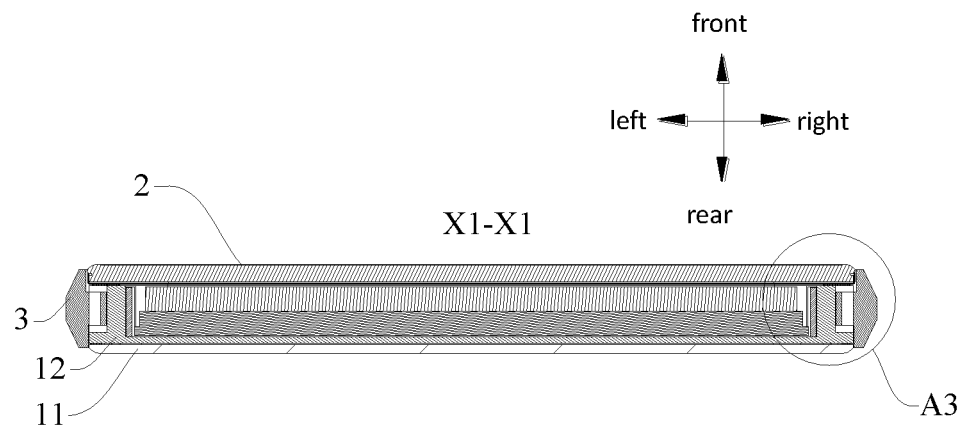
FIG. 7 illustrates a sectional view taken along line X1-X1 in FIG. 4.
Figure 8:
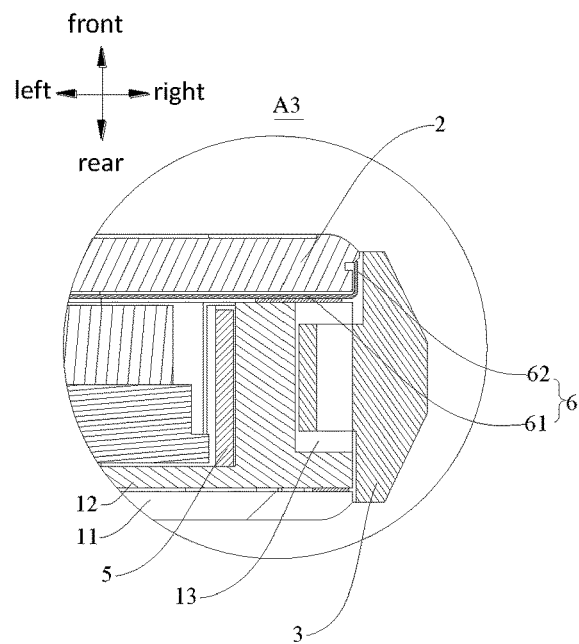
FIG. 8 illustrates an enlarged view of portion A3 circled in FIG. 7.
Figure 9:
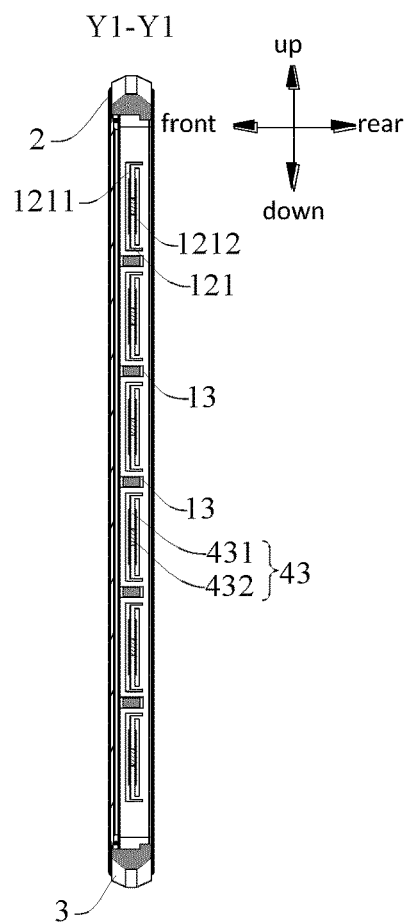
FIG. 9 illustrates a sectional view taken along line Y1-Y1 in FIG. 4.

As illustrated in FIGS. 5 and 6, the second sealing member 6 includes a body portion 61 and a bent portion 62, and the bent portion 62 is arranged at a circumferential edge of the body portion 61. The body portion 61 is coupled with an inner surface of the display assembly 2, and the bent portion 62 is located between the protective member 3 and the display assembly 2. Optionally, the second sealing member 6 can be sealedly coupled with the display assembly 2 by dispensing. Thus, the sealing effect of the second sealing member 6 can be improved.

An electronic device according to another embodiment of the present disclosure will be described below, wherein the same components are denoted by the same reference numerals as the above-mentioned embodiments.

The electronic device according to the embodiment of the present disclosure includes a middle frame 12, a display assembly 2, a rear cover 11, a protective member 3 and a driving assembly.

Specifically, referring to FIG. 3 and in combination with FIGS. 28 and 29, the middle frame 12 includes a sidewall arranged in an encircled manner. For example, the middle frame 12 can be formed into a rectangular frame structure. The display assembly 2 is located at a front side of the middle frame 12 and the rear cover 11 is located at a rear side of the middle frame 12. Referring to FIG. 1 and FIG. 3 and in combination with FIG. 31, the rear cover 11 can be formed into a substantially rectangular plate-shaped structure. Optionally, the rear cover 11 can be a glass member or a ceramic member. That is, the rear cover 11 can be made of glass or ceramic. Thus, the appearance of the electronic device 100 and the hand feeling of the electronic device 100 can be improved.

The protective member 3 is arranged on the sidewall of the middle frame 12. The protective member 3 has three position states: in an initial position, a front end of the protective member 3 is lower than or flush with a surface of the display assembly 2; in a first position, the front end of the protective member 3 exceeds the surface of the display assembly 2; in a second position, a rear end of the protective member 3 exceeds a surface of the rear cover 11.

For example, the protective member 3 can be arranged to the middle frame 12 and be movable among the initial position, the first position and the second position. In the first position, the protective member 3 moves such that the front end of the protective member 3 exceeds the outer surface of the display assembly 2. In the second position, the protective member 3 moves such that the rear end of the protective member 3 exceeds the outer surface of the rear cover 11. In the initial position, the front end of the protective member 3 is flush with or lower than the outer surface of the display assembly 2, and the rear end of the protective member 3 is flush with or lower than the outer surface of the rear cover 11.

Specifically, in the first position, the front end of the protective member 3 exceeds the outer surface of the display assembly 2, such that an outer periphery of the outer surface of the display assembly 2 is wrapped by the protective member 3 (as illustrated in FIGS. 12-18). Thus, with the protection of the protective member 3 to the display assembly 2, the display assembly 2 can be prevented from being damaged when the electronic device 100 drops.

In the second position, the rear end of the protective member 3 exceeds the outer surface of the rear cover 11, such that an outer periphery of the outer surface of the rear cover 11 is wrapped by the protective member 3 (as illustrated in FIGS. 19-26). Thus, with the protection of the protective member 3 to the rear cover 11, the rear cover 11 can be prevented from being damaged when the electronic device 100 drops.

Figure 10:
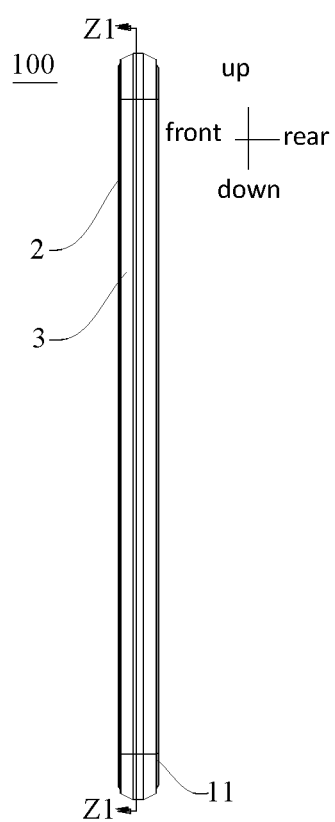
FIG. 10 illustrates a side view of the electronic device in FIG. 3.
Figure 11:
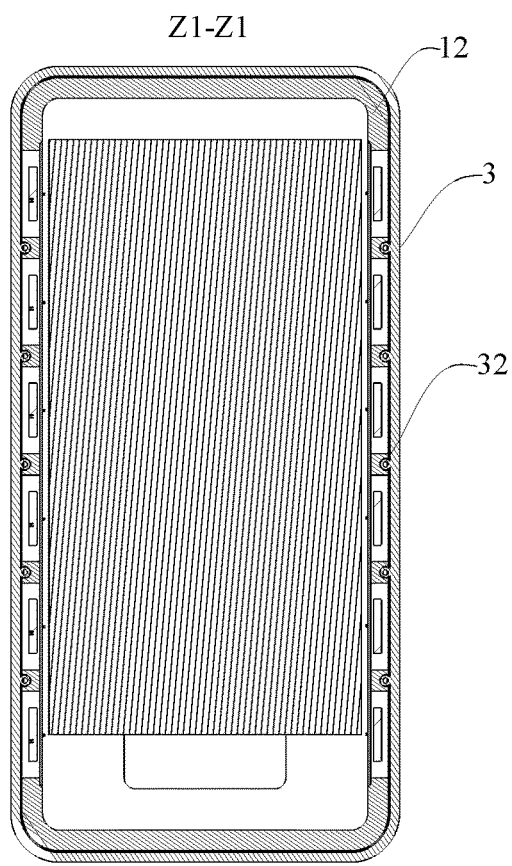
FIG. 11 illustrates a sectional view taken along line Z1-Z1 in FIG. 10.
Figure 12:
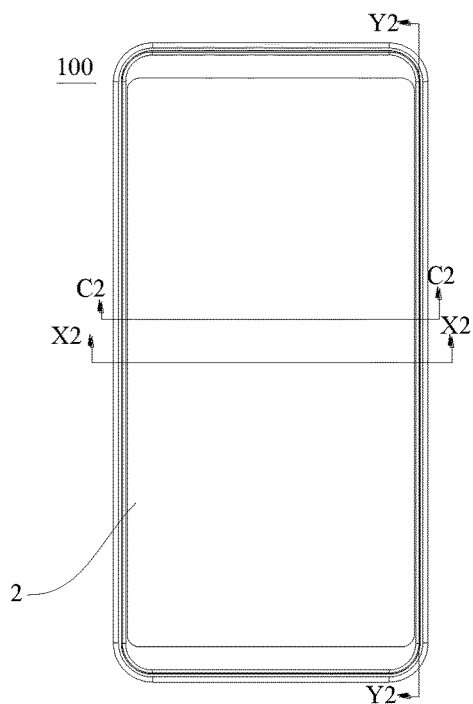
FIG. 12 illustrates another front view of an electronic device according to embodiments of the present disclosure, wherein a protective member is in a first position.
Figure 13:
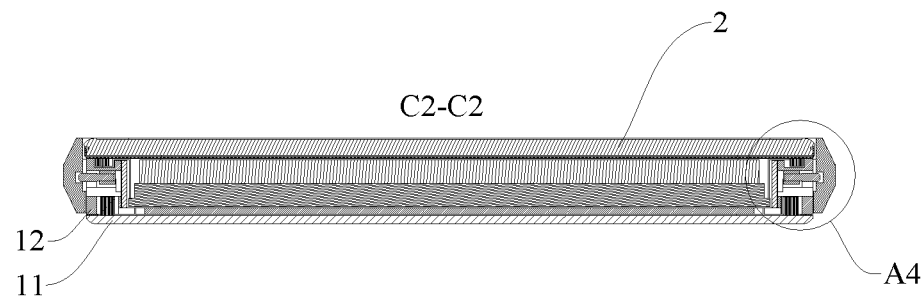
FIG. 13 illustrates a sectional view taken along line C2-C2 in FIG. 12.
Figure 14:
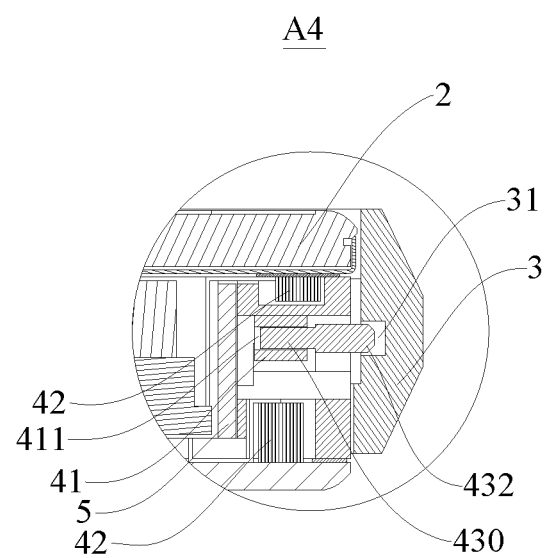
FIG. 14 illustrates an enlarged view of portion X4 circled in FIG. 13.
Figure 15:
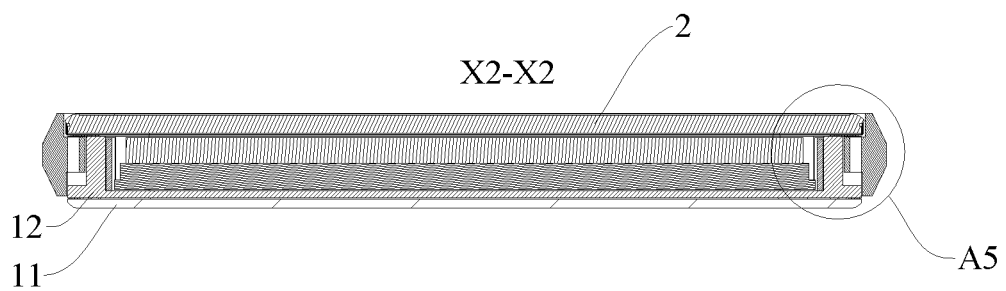
FIG. 15 illustrates a sectional view taken along line X2-X2 in FIG. 12.
Figure 16:
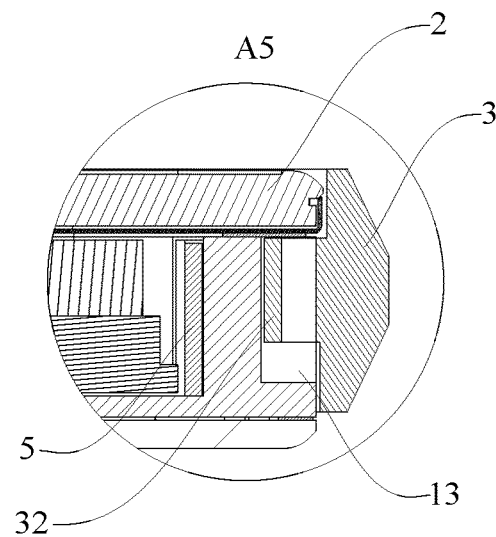
FIG. 16 illustrates an enlarged view of portion A5 circled in FIG. 15.
Figure 17:
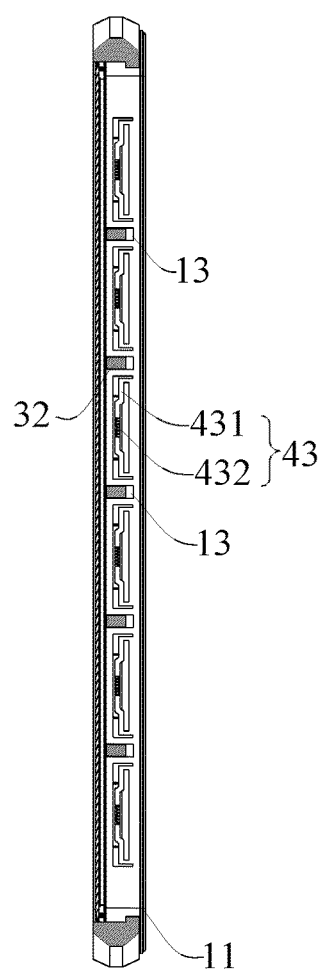
FIG. 17 illustrates a sectional view taken along line Y2-Y2 in FIG. 12.
Figure 18:
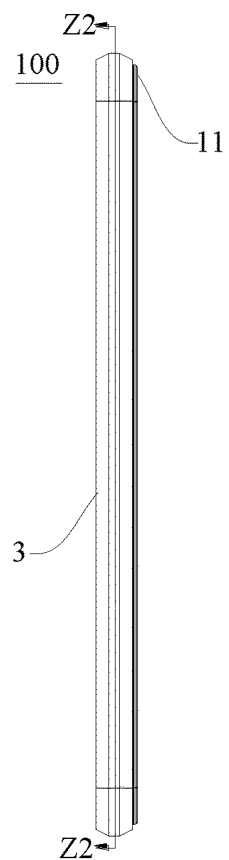
FIG. 18 illustrates a side view of the electronic device in FIG. 12.
Figure 19:
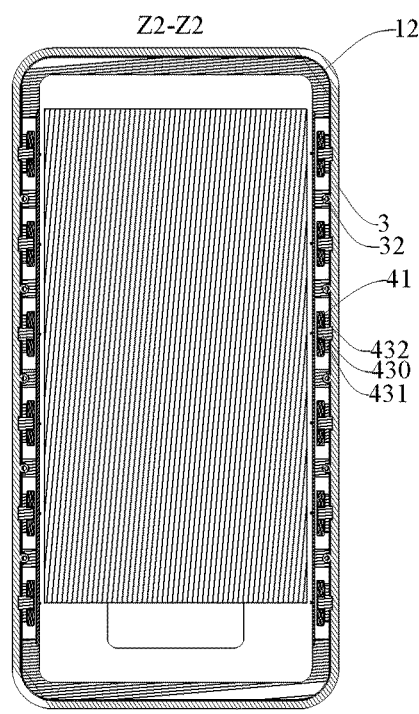
FIG. 19 illustrates a sectional view taken along line Z2-Z2 in FIG. 18.
Figure 20:
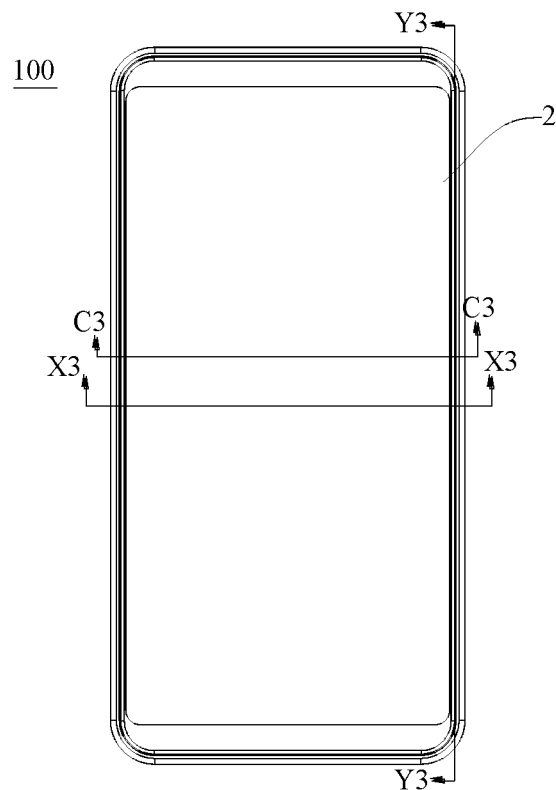
FIG. 20 illustrates still another front view of an electronic device according to embodiments of the present disclosure, wherein a protective member is in a second position.
Figure 21:
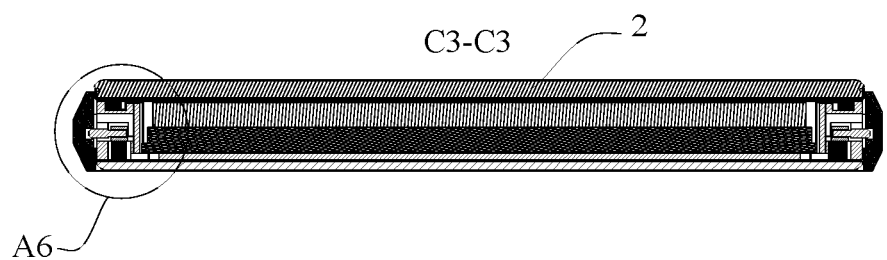
FIG. 21 illustrates a sectional view taken along line C3-C3 in FIG. 20.
Figure 22:
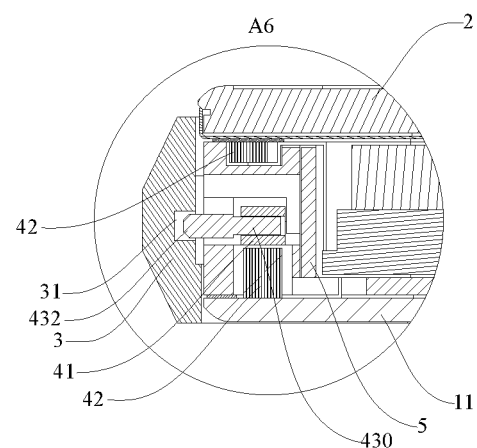
FIG. 22 illustrates an enlarged view of portion A6 circled in FIG. 21.
Figure 23:
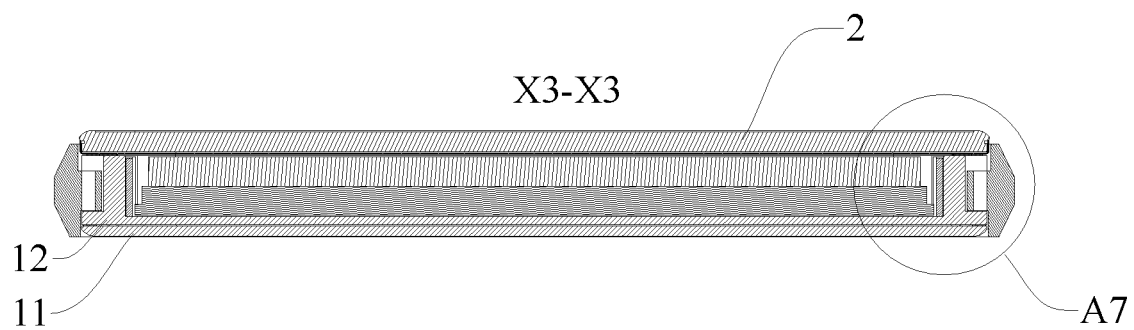
FIG. 23 illustrates a sectional view taken along line X3-X3 in FIG. 20.
Figure 24:
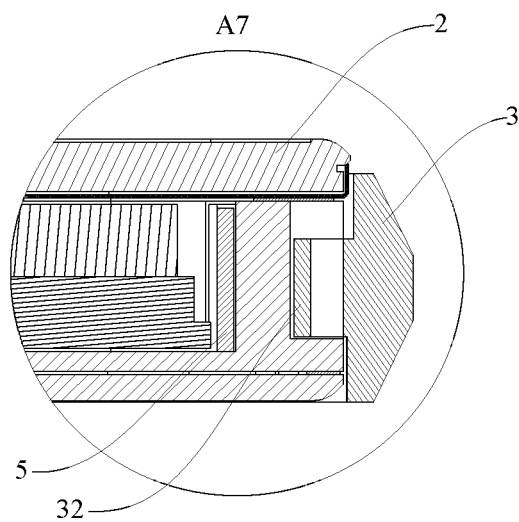
FIG. 24 illustrates an enlarged view of portion A7 circled in FIG. 23.
Figure 25:
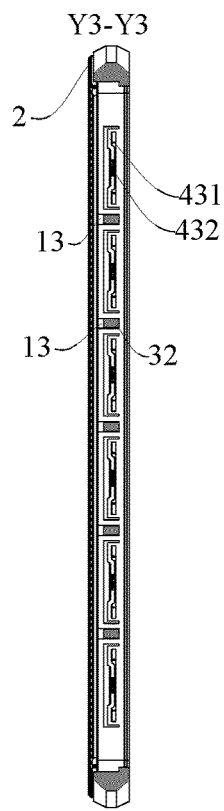
FIG. 25 illustrates a sectional view taken along line Y3-Y3 in FIG. 20.
Figure 26:
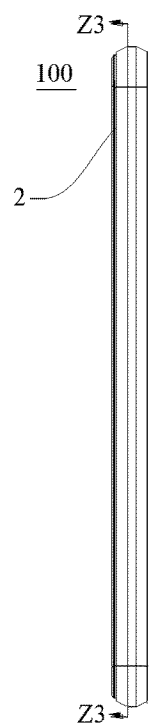
FIG. 26 illustrates a side view of the electronic device in FIG. 20.
Figure 27:
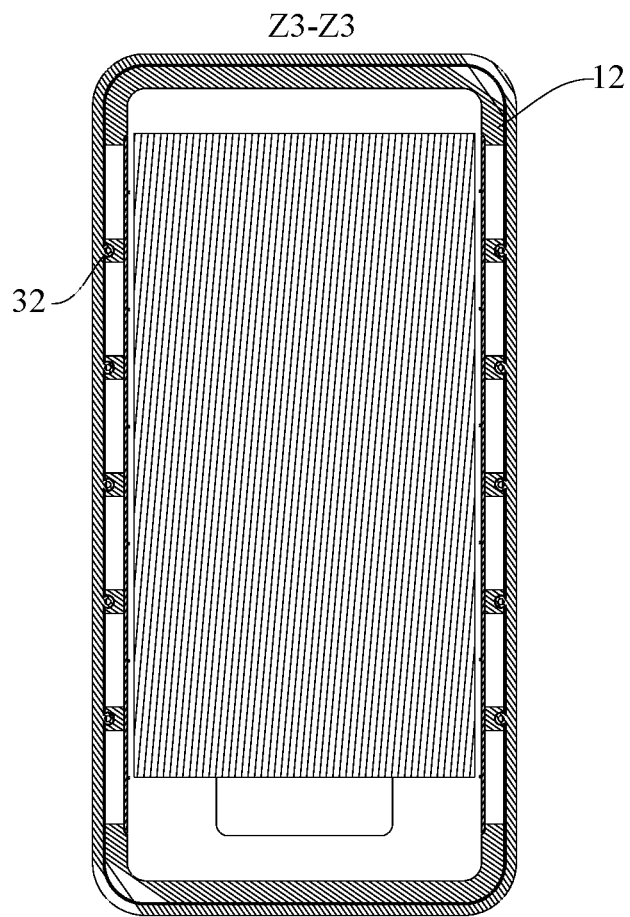
FIG. 27 illustrates a sectional view taken along line Z2-Z2 in FIG. 26.

In the initial position, the front end of the protective member 3 is flush with or lower than the outer surface of the display assembly 2, and the rear end of the protective member 3 is flush with or lower than the outer surface of the rear cover 11 (as illustrated in FIG. 10). Thus, when the electronic device 100 is in a non-dropping state, the overall appearance of the electronic device 100 can be effectively improved, thus avoiding the protective member 3 from affecting the aesthetics of the appearance of the electronic device 100.

When the electronic device 100 is in a non-dropping state, it should be understood as a state when the user normally uses the electronic device 100, or when the electronic device 100 is stationary, and the like.

The driving assembly can be arranged in the middle frame 12, and the driving assembly is configured to drive the protective member 3 to move from the initial position to the first position, or drive the protective member 3 to move from the initial position to the second position.

For example, when the display assembly 2 is falling towards the face, the protective member 3 can be driven by the driving assembly to move to the first position, such that the outer periphery of the outer surface of the display assembly 2 is wrapped by the protective member 3. Thus, with the protection of the protective member 3 to the display assembly 2, the display assembly 2 can be prevented from being damaged when the electronic device 100 drops. When the rear cover 11 is falling towards the face, the protective member 3 can be driven by the driving assembly to move to the second position, such that the outer periphery of the outer surface of the rear cover 11 is wrapped by the protective member 3. Thus, with the protection of the protective member 3 to the rear cover 11, the rear cover 11 can be prevented from being damaged when the electronic device 100 drops. Therefore, during the fall of the electronic device 100, whether the display assembly 2 is falling towards the face or the rear cover 11 is falling towards the face, the protective member 3 can be first brought into contact with the face, and absorb the impact of the face on the electronic device 100 to play a buffering role, thereby effectively avoiding the damage of the display assembly 2 and the rear cover due to the fall, further protecting the electronic device 100 and improving the anti-dropping performance of the electronic device 100.

For example, in some specific embodiments of the present disclosure, the electronic device 100 can be provided with a sensor used to sense a dropping state of the electronic device 100, and the sensor is coupled with the driving assembly. Specifically, when the electronic device 100 drops, the sensor can sense whether a surface of the electronic device 100 facing towards the face is the display assembly 2 or the rear cover 11, and the driving assembly drives the protective member 3 to move according to a sensing result of the sensor, so as to protect the display assembly 2 and the rear cover 11 by the protective member 3.

For the electronic device 100 according to the embodiment of the present disclosure, by providing the protective member 3 having three position states, the display assembly 2 and the rear cover can be protected by the protective member 3 and be prevented from being damaged during the fall of the electronic device 100, which improves the anti-dropping performance of the electronic device 100. Meanwhile, when the electronic device 100 is in a normal state, the aesthetics of the electronic device 100 can be improved. Moreover, the protective member 3 has a simple structure and low production cost, hence improving the cost-performance ratio of the electronic device 100.

According to some specific embodiments of the present disclosure, the driving assembly drives the protective member to move from the first position to the initial position or drives the protective member to move from the second position to the initial position after the electronic device drops. Thus, after the electronic device lands, the protective member can be automatically restored to the initial position, which can effectively improve the overall appearance of the electronic device 100 and avoid the effect of the protective member 3 on the aesthetics of the appearance of the electronic device 100.

It should be understood that the structure and working principle of the driving assembly in the present embodiment can be the same as those of the driving assembly in the above embodiments, which will not be described in detail herein.

It should be noted that "the electronic device 100" of the present disclosure includes, but is not limited to devices for receiving/transmitting a communication signal via a wired line connection (for example, via Public Switched Telephone Network (PSTN), Digital Subscriber Line (DSL), a digital cable, direct cable connection, and/or another data connection/network) and/or via a wireless interface (for example, cellular networks, wireless local area networks (WLANs), digital television networks (such as DVB-H networks), satellite networks, AM-FM broadcast transmitters, and/or another communication terminal). Examples of the electronic device 100 include, but are not limited to, satellite or cellular telephones; personal communication system (PCS) devices that may combine cellular radiotelephone with data processing, fax, and data communication capabilities; PDAs that may include radiotelephones, pagers, Internet/Intranet access, web browsers, memo pads, calendars, and/or global positioning system (GPS) receivers; and conventional laptop and/or palmtop receivers or other electronic devices including radiotelephone transceivers.

The electronic device 100 can be a device capable of acquiring data from the outside and processing the data, or the electronic device 100 can be a device including a built-in battery and capable of charging the battery by drawing current from the outside, for example, a mobile phone (the embodiments as illustrated in FIGS. 1-35), a tablet computer, a computing device or an information display device. The mobile phone is merely an example of the electronic device 100, which is not specifically limited in the present disclosure. The present disclosure can be applied to mobile phones, tablet computers and other electronic devices 100, which is not limited in the present disclosure.

In embodiments of the present disclosure, the mobile phone can include a radio-frequency circuit, a memory, an input unit, a wireless fidelity (Wi-Fi) module, a display assembly 2, a sensor, an audio circuit, a processor, a fingerprint identification assembly, a battery and the like.

The radio-frequency circuit can be used to receive and transmit a signal during information transmission and reception or during a call. Especially, when downlink information from a base station is received, the radio-frequency circuit sends the downlink information to the processor for processing, and additionally sends uplink data from the mobile phone to the base station. Usually, the radio-frequency circuit includes but is not limited to an antenna, at least one amplifier, a transceiver, a coupler, a low-noise amplifier, a duplexer and etc. In addition, the radio-frequency circuit can communicate with the network and other devices via wireless communication.

The memory can be used to store software programs and modules, and the processor runs various function applications in the mobile phone and performs data processing by running the software programs and modules stored in the memory. The memory mainly includes a program storage area and a data storage area. The program storage area can store an operating system, at least one application program required for a function (such as a voice playback function, an image playback function and etc.); the data storage area can store data (such as audio data, contacts and etc.) created according to the use of the mobile phone. In addition, the memory may include a high-speed random access memory, and may also include a non-volatile memory, such as at least one disk storage device, a flash memory device, or other volatile solid-state memory devices.

The input unit can be configured to receive incoming numbers or character information, and generate a key signal related to user settings and function control of the mobile phone. Specifically, the input unit can include a touch panel and other input devices. The touch panel, also known as a touch screen, can collect a touch operation made by a user on or near the touch panel (for example, an operation made by the user on the touch panel or near the touch panel by means of a finger, a touch pen or any other suitable object or accessory), and drive the corresponding connection device according to a preset program.

Optionally, the touch panel can include a touch detection device and a touch controller. The touch detection device is configured to detect a touch orientation of the user, detect a signal from the touch operation, and transmit the signal to the touch controller. The touch controller is configured to receive the touch information from the touch detection device, convert it into contact coordinates and send the contact coordinates to the processor, and is also configured to receive and execute a command from the processor. In addition, it is possible to realize the touch panel in resistive type, capacitive type, infrared type, surface acoustic wave type and other types. The input unit may include other input devices apart from the touch panel. Specifically, other input devices may include, but are not limited to one or more of a physical keypad, a function key (e.g. a volume control button, an on/off button, etc.), a trackball, a mouse and an operating rod.

The display assembly 2 can include a display panel, and optionally, the display panel can be configured in forms of a liquid crystal display (LCD), an organic light-emitting diode (OLED) and the like. Further, the touch panel can overlay the display panel; when the touch panel detects a touch operation on or near it, the touch operation is sent to the processor to determine which type the touch event belongs to, and then the processor provides a corresponding visual output on the display panel according to the type of the touch event.

The audio circuit, the loudspeaker and the microphone can provide an audio interface between the user and the mobile phone. The audio circuit can transmit an electrical signal converted from the received audio data to the loudspeaker, and the loudspeaker converts the electrical signal into an audio signal to be output. On the other hand, the microphone converts the collected audio signal into the electrical signal, and the audio circuit receives and converts the electrical signal into audio data, and transmits the audio data to the processor. After processed by the processor, the audio data is sent to, for example, another mobile phone via the radio-frequency circuit, or is output to the memory for further processing.

Wi-Fi is a short-distance wireless transmission technology, and the electronic device can help the user to send and receive e-mails, browse websites, and access streaming media by means of the Wi-Fi module which provides the user with wireless broadband access to the Internet. However, it could be understood that the Wi-Fi module is not a necessary component of the mobile phone and can be omitted as needed without changing the nature of the present disclosure.

The processor is a control center of the electronic device and mounted on a circuit board assembly. The processor is coupled to various parts of the mobile phone by means a variety of interfaces and lines, and performs various functions of the mobile phone and data processing by running or executing software programs and/or modules stored in the memory and by invoking the data stored in the memory, so as to monitor the electronic device overall. Optionally, the processor can include one or more processing units. Preferably, the processor may be integrated with an application processor and a modem processor, in which the application processor mainly handles the operating system, the user interface and the application program, while the modem processor mainly deals with wireless communication.

The power source can be logically coupled to the processor by means of a power management system, to manage functions such as charging, discharging, and power management by means of the power management system. Although not shown, the electronic device may also include a Bluetooth module, and a sensor (such as an attitude sensor, a light sensor and other sensors like a barometer, a hygrometer, a thermometer and an infrared sensor), which will not be described herein.

Reference throughout this specification to "an embodiment," "some embodiments," "an illustrative embodiment," "an example", "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Moreover, the particular features, structures, materials, or characteristics described may be combined in any suitable manner in one or more embodiments or examples.

Although embodiments of the present disclosure have been illustrated and described above, it should be understood by those skilled in the art that changes, modifications, alternatives, and variations can be made in the embodiments without departing from principles and purposes of the present disclosure. The scope of this application is limited by the claims and their equivalents.

The invention claimed is:

1. An electronic device, comprising:
a middle frame comprising a sidewall;
a display assembly located at a front side of the middle frame;
a rear member located at a rear side of the middle frame;
a protective member coupled to the sidewall of the middle frame and movable in forward and rearward directions, wherein the protective member has an initial position where a front end of the protective member is lower than or flush with an outer surface of the display assembly and a rear end of the protective member is lower than or flush with an outer surface of the rear member; and a front position where the front end of the protective member exceeds the outer surface of the display assembly and protects the display assembly when the electronic device drops; and
a driving assembly provided to the middle frame and configured to drive the protective member to move away from the initial position and move back to the initial position,
wherein the driving assembly comprises an elastic member, a first magnet, and at least one second magnet; the elastic member has a first end coupled with the first magnet and a second end fitted with the protective member; and the at least one second magnet cooperates with the first magnet to urge the elastic member to drive the protective member to move towards the front position,
wherein the middle frame is formed with a mounting groove, the elastic member is arranged in the mounting groove, and the elastic member is configured to be elastically deformable in a moving direction of the protective member to normally drive the protective member to be restored to the initial position.

2. The electronic device according to claim 1, wherein the protective member further has a rear position where the rear end of the protective member exceeds the outer surface of the rear member protects the rear member when the electronic device drops.

3. The electronic device according to claim 2, wherein the at least one second magnet cooperates with the first magnet to urge the elastic member to drive the protective member to move towards the rear position.

4. The electronic device according to claim 3, wherein the first magnet is a permanent magnet, and the second magnet is an electromagnet.

5. The electronic device according to claim 4, further comprising:
a sensor configured to sense a dropping state of the electronic device; and
a controller coupled with the at least one second magnet and the sensor, and configured to control the at least one second magnet.

6. The electronic device according to claim 5, wherein the controller controls the at least one second magnet to be powered on and to urge the elastic member to drive the protective member to move towards the front position, when the sensor senses a fall of the electronic device with the display assembly facing downwards; and the controller controls the at least one second magnet to be powered off, when the sensor senses a standstill of the electronic device.

7. The electronic device according to claim 5, wherein the controller controls the at least one second magnet to be powered on and to urge the elastic member to drive the protective member to move towards the rear position, when the sensor senses a fall of the electronic device with the rear member facing downwards; and the controller controls the at least one second magnet to be powered off, when the sensor senses a standstill of the electronic device.

8. The electronic device according to claim 3, wherein the protective member is formed with a fitting groove, and the second end of the elastic member is inserted into the fitting groove to be fitted with the protective member.

9. The electronic device according to claim 8, wherein the elastic member comprises:
   an elastic arm provided in the mounting groove, a first movement space defined between a side surface of the elastic arm adjacent to the display assembly and an inner wall of the mounting groove opposite to the side surface of the elastic arm adjacent to the display assembly, and a second movement space defined between a side surface of the elastic arm away from the display assembly and an inner wall of the mounting groove opposite to the side surface of the elastic arm away from the display assembly; and
   a snapping head provided on the elastic arm and inserted into the fitting groove to be fitted with the protective member.

10. The electronic device according to claim 9, wherein the elastic arm is movable in a direction close to and away from a center of the middle frame, and the snapping head is movable between a first position where the snapping head is fitted with the fitting groove and a second position where the snapping head is separated from the fitting groove.

11. The electronic device according to claim 1, wherein the protective member is formed in a closed-loop shape and is located outside the display assembly, and a plurality of driving assemblies are provided and spaced apart from each other along a circumferential direction of the display assembly.

12. The electronic device according to claim 1, wherein one of the middle frame and the protective member is provided with a plurality of limiting grooves spaced apart from each other, and the other one of the middle frame and the protective member is provided with a plurality of limiting protrusions fitted with the limiting grooves.

13. An electronic device comprising:
   a middle frame comprising a sidewall;
   a display assembly located at a front side of the middle frame;
   a rear member located at a rear side of the middle frame;
   a protective member movably coupled to the sidewall of the middle frame, wherein the protective member has an initial position where a front end of the protective member is lower than or flush with an outer surface of the display assembly and a rear end of the protective member is lower than or flush with an outer surface of the rear member; and a rear position where the rear end of the protective member exceeds the outer surface of the rear member and protects the rear member when the electronic device drops; and
   a driving assembly provided to the middle frame and configured to drive the protective member to move from the initial position to the rear position,
   wherein the driving assembly comprises an elastic member, a first magnet, and at least one second magnet; the elastic member has a first end coupled with the first magnet and a second end fitted with the protective member; the at least one second magnet cooperates with the first magnet to urge the elastic member to drive the protective member to move towards the rear position,
   wherein the protective member is formed with a fitting groove, and the second end of the elastic member is inserted into the fitting groove to be fitted with the protective member;
   the middle frame is formed with a mounting groove, the elastic member is arranged in the mounting groove, and the elastic member is configured to be elastically deformable in a moving direction of the protective member to normally drive the protective member to be restored to the initial position.

14. An electronic device, comprising:
   a middle frame comprising a sidewall;
   a display assembly located at a front side of the middle frame;
   a rear member located at a rear side of the middle frame;
   a sensor configured to sense a dropping state of the electronic device; and
   a protective member movably coupled to the sidewall of the middle frame, wherein the protective member has an initial position where a front end of the protective member is lower than or flush with an outer surface of the display assembly and a rear end of the protective member is lower than or flush with an outer surface of the rear member; a front position where the front end of the protective member exceeds the outer surface of the display assembly when the sensor senses a fall of the electronic device with the display assembly facing downwards; and a rear position where the rear end of the protective member exceeds the outer surface of the rear member when the sensor senses a fall of the electronic device with the rear member facing downwards; and
   a driving assembly provided to the middle frame and configured to drive the protective member to move away from the initial position and move back to the initial position,
   wherein the driving assembly comprises an elastic member, a first magnet, and at least one second magnet; the elastic member has a first end coupled with the first magnet and a second end fitted with the protective member; and the at least one second magnet cooperates with the first magnet to urge the elastic member to drive the protective member to move towards the front position or the rear position,
   wherein the middle frame is formed with a mounting groove, the elastic member is arranged in the mounting groove, and the elastic member is configured to be elastically deformable in a moving direction of the protective member to normally drive the protective member to be restored to the initial position.

* * * * *